(12) United States Patent
Wellhausen et al.

(10) Patent No.: US 7,371,657 B2
(45) Date of Patent: May 13, 2008

(54) METHOD FOR FORMING AN ISOLATING TRENCH WITH A DIELECTRIC MATERIAL

(75) Inventors: Uwe Wellhausen, Dresden (DE); Henry Heidemeyer, Dresden (DE); Joern Regul, Dresden (DE)

(73) Assignee: Infineon Technologies AG, Munich (DE)

( * ) Notice: Subject to any disclaimer, the term of this patent is extended or adjusted under 35 U.S.C. 154(b) by 350 days.

(21) Appl. No.: 11/252,878

(22) Filed: Oct. 19, 2005

(65) Prior Publication Data

US 2007/0087516 A1 Apr. 19, 2007

(51) Int. Cl.
*H01L 21/76* (2006.01)
(52) U.S. Cl. ............... 438/430; 438/424; 257/E21.546

(58) Field of Classification Search ............... 438/424, 438/430; 257/E21.546
See application file for complete search history.

(56) References Cited

U.S. PATENT DOCUMENTS

| 6,669,799 | B2 | 12/2003 | Putnam et al. |
| 6,864,151 | B2 | 3/2005 | Yan et al. |
| 6,869,860 | B2 | 3/2005 | Belyansky et al. |
| 7,291,533 | B2 * | 11/2007 | von Schwerin ............. 438/270 |
| 2005/0159520 | A1 * | 7/2005 | Lamb et al. ................ 524/236 |

* cited by examiner

*Primary Examiner*—Bradley K Smith
(74) *Attorney, Agent, or Firm*—Patterson & Sheridan, L.L.P.

(57) ABSTRACT

The present invention relates to a method of forming an isolating trench of a semiconductor device with a dielectric material, and to a method of forming an isolating trench in a memory device.

21 Claims, 7 Drawing Sheets

METHOD FOR FORMING AN ISOLATING TRENCH WITH A DIELECTRIC MATERIAL

TECHNICAL FIELD OF THE INVENTION

The present invention relates to a method of forming an isolating trench of a semiconductor device with a dielectric material, and to a method of forming an isolating trench in a memory device.

BACKGROUND OF THE INVENTION

As ground rule dimensions shrink in integrated circuits, the problem of filling high aspect ratio trenches increases, in particular for isolation trenches used in shallow trench isolation processes, STI, which is commonly used in advanced processing.

Furthermore, with higher aspect ratios it becomes increasingly difficult to fill trenches with dielectric material free of voids and gaps. A possibility to overcome this problem is to use spin-on dielectric materials in order to fill the trenches. However, spin-on dielectric materials or spin-on glass have to subjected to a densification and/or curing process. The densification process is necessary in order to obtain e.g. a low wet etch rate for further wet etch processes. Unfortunately, the densification process is accompanied by a shrinkage of the material, which is not homogeneous in depth for high aspect ratio trenches. This is caused by the material sticking to the walls of the trenches and strongly depends on the shape of the filled structure. Particularly, for integration schemes for three-dimensional devices chemicals attack the dielectric filler material of the isolation trench whereby the insufficient curing and/or densification results in a high etching rate which is unfavourable.

The proposed invention describes a method which uses a sacrificial material in order to provide a reservoir of the filler material which will be consumed by a subsequent densification process. Additionally, the removal of the sacrificial material prior to the densification ensures a densification process with increased homogeneity.

U.S. Pat. No. 6,869,860 describes a filling of high aspect ratio isolation structures with polysilazane-based materials. In this document, spin-on glass or spin-on dielectric material for filling trenches of semiconductor devices, e.g. shallow trench isolation (STI), is described.

An integrated circuit containing a set of thermally sensitive circuit elements having a thermal budget associated therewith and comprising a set of isolation trenches is processed by means of the following steps: providing a silicon substrate; forming at least one circuit element having a thermal budget prior to forming the isolation structure; etching said set of trenches in said silicon substrate; filling said set of trenches with a spin-on trench dielectric material containing silazane; heating said substrate at a temperature of less than about 450° C. converting the stress in said trench dielectric material from tensile stress to compressive stress by heating in an ambient containing H$_2$O at a temperature between approximately 450° C. and about 900° C.; annealing said substrate by heating in an ambient containing oxygen at a temperature above 800° C.; and completing said integrated circuit. Additionally, the trench dielectric material is planarized by CMP after the step of annealing in an oxygen ambient; and an anneal in an ambient containing water vapour is performed after the step of planarizing for a time sufficient to convert silicon nitrogen bonds to silicon oxygen bonds in trench dielectric material at the bottom of the trench.

Additionally, U.S. Pat. No. 6,699,799 B2 discloses a method for forming a semiconductor device. The method of forming a semiconductor device includes a liner which is conformably stacked on a semiconductor substrate before depositing a spin-on glass layer thereon. Thereafter, the spin-on glass layer is cured, preferably in an ambient of oxygen radicals formed at a temperature of 1000° C. or higher when oxygen or hydrogen are supplied. The oxygen radicals are preferably formed by irradiating ultra-violet rays to ozone or forming oxygen plasma. The spin-on glass layer is preferably made of polysilazane-based materials which may promote a conversion of the spin-on glass layer into a silicon oxide layer. During the high temperature annealing process, the silicon layer arranged beneath the spin-on glass layer is converted into a silicon oxide layer by diffused oxygen.

SUMMARY OF THE INVENTION

The present invention provides an insulating filling material which has improved technical features, e.g. a lower wet etch rate and a higher density.

The present invention also provides a method for producing an insulating spin-on dielectric material or an insulating spin-on glass material with improved chemical and mechanical properties.

The present invention also provides, in another embodiment, a method of forming an insulating trench using a spin-on dielectric material on a semiconductor device with an improved homogeneity. Furthermore, the present invention provides a method for forming an isolating material made of a liquid dielectric material with a lower wet etch rate and a higher density. The present invention refers to a method for filling a trench with a liquid dielectric material, wherein the liquid dielectric material comprises particles wherein the particles are chemically converted, e.g. oxidised, during an annealing process forming oxidized particles with an enlarged volume compared to the volume of the particle.

In one embodiment of the present invention, there is a method of forming an isolating trench on a semiconductor device with a liquid dielectric material comprising:

providing a substrate;

forming a trench in the substrate arranged between sidewalls;

forming a space in the sidewall which is directly adjacent to the trench and connected by an opening face with the trench;

filling the space in the trench with the liquid dielectric material;

solidifying the liquid dielectric material;

removing the sidewalls and curing the dielectric filling in the trench.

In another embodiment of the present invention, there is a method of forming an isolating trench on a semiconductor device with a liquid dielectric material comprising:

providing a substrate;

forming a trench in the substrate, forming a hole in the substrate which is directly adjacent to the trench and connected by an opening face with the trench;

filling the hole with sacrificial material by providing a space in the hole with an opening face to the trench;

filling the trench and the space with the liquid dielectric material;

solidifying the liquid dielectric material;

removing the sacrificial material of the hole and curing the dielectric filling in the trench.

In one aspect of the invention, there is a method for forming an isolating trench with an improved dielectric material. This improved dielectric material is achieved by a controlled lateral recess of a sacrificial material to provide a reservoir for the fill material of the trench which will be consumed by the subsequent curing process. The present invention provides an advantage of proposing a method for producing an isolating trench with a liquid dielectric material which after curing exhibits improved mechanical and chemical properties with regard to wet etching and a higher density.

The present invention may be used by CMOS manufacturing processes, e.g. by producing isolating trenches with a high aspect ratio and for producing three-dimensional devices, e.g. FIN-FET.

A further aspect of the present invention provides an improved liquid dielectric material resulting in an isolating trench fill with less shrinkage of the material during the curing process. This is accomplished, in one embodiment, by a liquid dielectric material comprising particles which are chemically converted, e.g. oxidized, during a subsequent curing process forming oxidized particles with an enlarged volume compared to the volume of the particle.

BRIEF DESCRIPTION OF THE INVENTION

The present invention will be described in more detail below with reference to the exemplary embodiments and drawings, in which.

DETAILED DESCRIPTION OF THE INVENTION

The invention may be used in any technical field using dielectric material. The invention is useful for producing isolating trenches with high aspect ratios, e.g. for producing isolating trenches for semiconductor devices. The inventive methods may be used for producing isolating trenches for three-dimensional electronic devices, e.g. FIN-FET. Additionally, the inventive method may be used in CMOS processes and by producing memory devices, e.g. DRAM memories or logic devices.

The invention is described considering a DRAM memory and a method for producing a DRAM memory as example. However, the use of the inventive method is not restricted to this example. A DRAM memory comprises memory cells with transistors and a data storing elements, e.g. a trench capacitor. The storing element is produced in a semiconductor substrate 1. The semiconductor substrate 1 is usually formed of a silicon wafer. On an upper surface of the substrate 1, trenches 2 are formed. These trenches may be used for different elements, circuits or devices and applications to form isolating dielectric trenches. Adjacent to the trenches 2 holes 3 are introduced into the surface of the substrate 1. The trenches 2 and the holes 3 may be etched into the substrate 1 by any convenient process, e.g. a reactive ion etch or a wet etch process.

Figure 1:
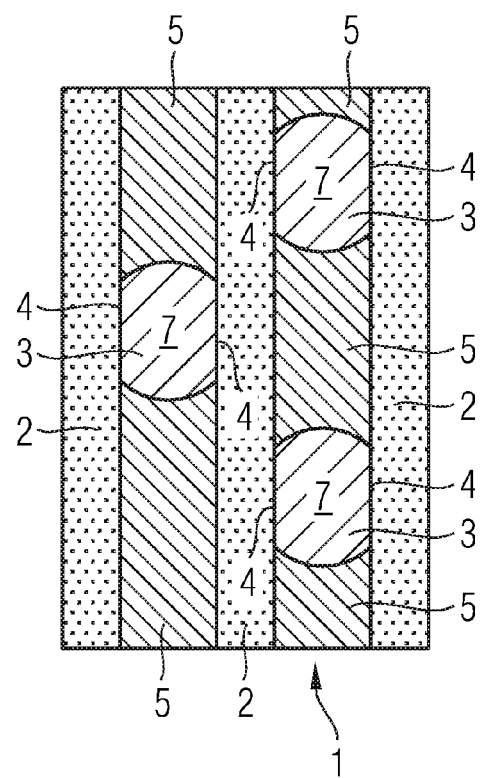
FIG. 1 shows a substrate with trenches and filled holes.

The holes 3 are directly adjacent to the trenches 2 and a hole 3 comprises an opening face 4 directly connecting a trench 2 to the hole 3. In the depicted embodiment, a hole 3 is arranged between two trenches 2 and connected to the two adjacent trenches 2 with opening faces. The Figure shows three trenches 2 that are arranged in parallel to each other. The substrate 1 comprises a lot of trenches 3, whereby FIG. 1 depicts only a part of the substrate 1.

Between the trenches 2 and the holes 3, substrate material 5 is arranged. The bottom of the hole 3 may be part of an inner electrode of a trench capacitor or part of a drain or source region of a transistor, i.e. a transistor of a memory cell. The transistor and the capacitor are arranged in a lower region of the substrate 1. The hole 3 is filled with a sacrificial material 7, e.g. with polysilicon. The sacrificial material 7 comprises the opening faces 4 as plane surfaces bordering the trenches 2.

Figure 2:
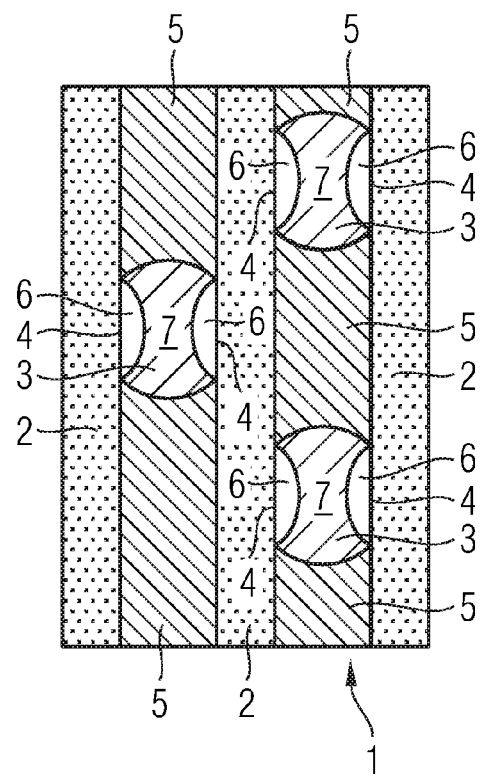
FIG. 2 shows a substrate with trenches and holes whereby the sacrificial material of the holes is recessed from the side of the trenches.

In a subsequent process step, spaces 6 are introduced in the opening faces 4 of the sacrificial material 7. This process step is depicted in FIG. 2. At the opening faces 4, the sacrificial material 7 of the holes 3 comprises spaces 6. The spaces 6 constitute recesses in the sacrificial material 7 which are open in the direction of the trenches 2.

The spaces 6 are introduced into the sacrificial material 7, e.g. by an isotropic selective wet etching process. An etching liquid is introduced in the trenches 2 and the sacrificial material 7 is etched from the side of the opening faces 4. An upper surface of the sacrificial material 7 is preferably not recessed. In another embodiment, the sacrificial material 7 may be deposited in the holes 3 with spaces 6 adjacent to the opening faces 4. In this embodiment the sacrificial material 7 is deposited with the spaces 6 in one process step.

Figure 3:
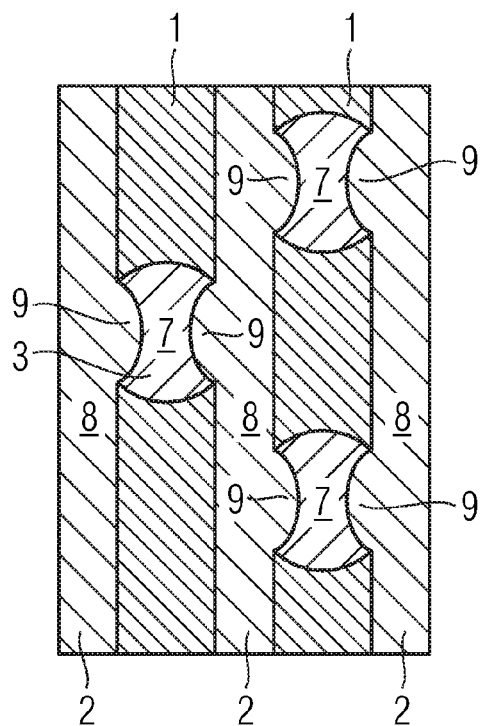
FIG. 3 shows filled trenches of the substrate.

In a following process step, the trenches 2 and the spaces 6 are filled with dielectric material. For example silicon oxide, SiO2, is deposited with the high density plasma HDP, technique. Although other dielectric materials may be deposited with a chemical vapour deposition (CVD) process. In a further embodiment a liquid dielectric material e.g. a polysilazane-based spin-on dielectric material 8 is filled in the trenches 2 and spaces 6. Depending on the embodiment, a spin-on glass may be used for filling up the trenches 2 and the spaces 6 of the sacrificial material, as well, as shown in FIG. 3. In the spaces 6, extended parts 9 are formed with the spin-on dielectric material 8.

A trench dielectric material filling substance referred to as a spin-on dielectric (SOD) or spin-on glass (SOG) is applied to the substrate 1, which is rotated in order to spread the material quite uniformly across the surface. The material which has a suitable low viscosity will penetrate into the various apertures and overfill the holes 3 and the trenches 2. Depending on the embodiment of the process, the overfilled substrate 1 is planarized by a chemical mechanical polishing process or by an etch back step in order to remove the excess filler material.

Figure 4:
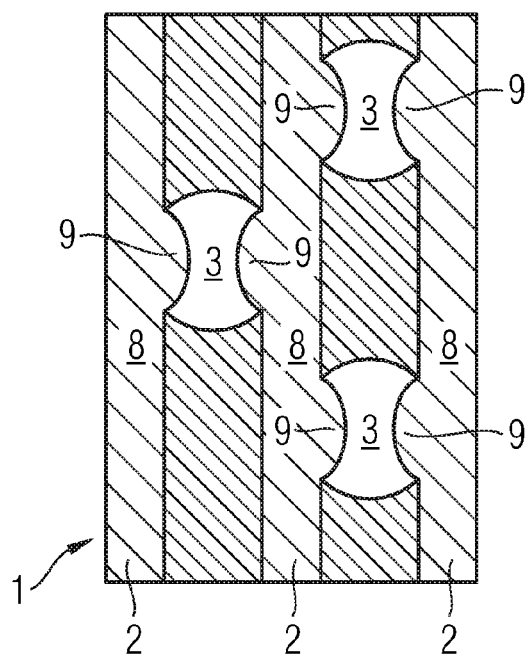
FIG. 4 shows the structure after removing the sacrificial material
Figure 5:
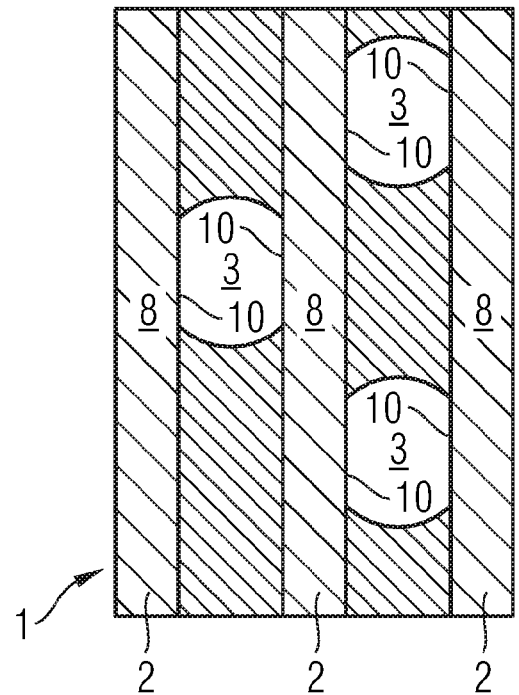
FIG. 5 shows the structure after the final curing process.

In a further process step, the dielectric material especially the liquid dielectric material is solidified, e.g. by an annealing or a pre-curing process. Then the sacrificial material 7 is removed from the holes 3 and the dielectric material 8 remains in the trenches 2 and in the region of the spaces 6 as shown in FIG. 4. The dielectric material 8 is cured in a final curing process, wherein the dielectric material 8 shrinks. Depending on the used dielectric material, the shrinkage volume is less or more. Especially the liquid dielectric material shows a large shrinkage. According to the shrinkage of the dielectric material 8, the extended parts 9 are withdrawn from the holes 3 resulting in a more or less plane sidewall 10 of the dielectric material 8 in the trenches 2 adjacent to the holes 3, as shown in FIG. 5. For achieving a plane sidewall 10, shape and volume of the space 6 are calculated depending on the dielectric material which is used for filling the trenches 2.

The final curing process may comprise an annealing process in an oxidizing ambient for a spin-on dielectric material. A conventional step of annealing in an ambient containing water vapour converts the nitrogen and hydrogen and the silazane to ammonia and molecular hydrogen which escapes from the material, whereby a residue remains which is largely silicon oxide. Therefore, the trenches 2 are filled with dielectric filling material made of silicon oxide forming isolating trenches 2. The presence of oxygen in the ambient assists in converting Si—N bonds to Si—O bonds. The properties of the final dielectric material 8 in the trenches 2 depend on the degree to which this conversion has been accomplished. Depending on the used process, a pre-baking step may be used before the sacrificial material 7 is removed from the hole 3. Additionally, the structure may be chemically-mechanically polished on the surface to remove the excess spin-on dielectric material from the surface of the substrate 1 before the sacrificial material 7 is removed.

During the final curing process, the substrate 1 may be annealed in a water vapour at a temperature in the range of 450 to 800° C. This process has the advantage that the extended parts 9 of the dielectric material 8 arranged in the trenches 2 may shrink freely during the final curing process and a higher density of the dielectric material in the trenches 2 is achieved. This has the advantage that the dielectric material 8 has lower wet etching rates and less stress. The dielectric material may easily shrink in the region of the opening faces 4 and become more dense in this area as there is no clamping to a sidewall. The material of the extended parts 9 may compensate a volume loss due to the shrinking process during the curing process. Preferably, the volume of the spaces 6 is defined comparably to the shrink volume resulting in a almost plane face at the region of the extended parts, as shown in FIG. 5.

Figure 6:
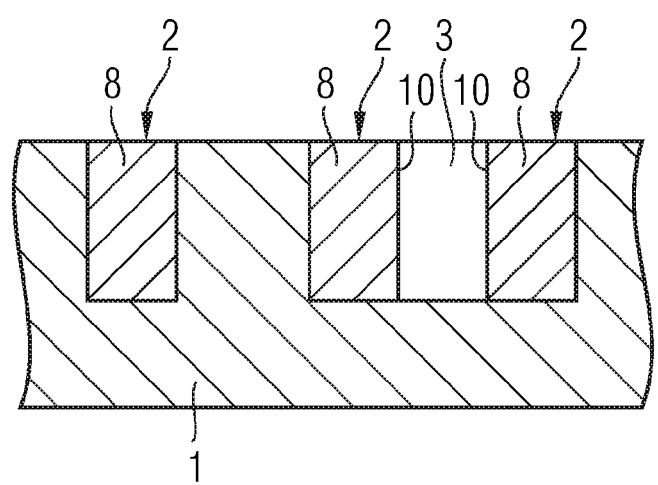
FIG. 6 shows a cross-sectional view of the substrate with trenches and holes.

FIG. 6 depicts a cross-sectional view of the substrate 1 with the trenches 2 filled with dielectric material 8 after the final curing process, the trenches 3 and the holes 2 having the same depth, which is not necessarily the case.

In a further process step, the holes 3 are filled with electrically conductive material for forming e.g. a bit contact which is used for electrically connecting a bit line to a memory cell or forming an electrical contact to an inner electrode of a deep trench capacitor of a DRAM.

The substrate material 5 between two holes 3 and two neighboured trenches 2 filled with dielectric isolating material 8 may be processed to active areas of transistors.

In a further embodiment, a liquid dielectric material is used as filling material comprising particles, e.g. silicon particles which oxidize during the curing process and enlarge their volume. This method may compensate at least a portion of the volume loss due to the shrinkage during the curing process. For the oxidizing process, an anneal in water vapour at a temperature in the range of 450 to 800° C. is used for a time period of 20 to 120 minutes. This ensures that the particles, e.g. oxidize to particle oxygen bonds. As particles, e.g. silicon powder may be used which oxidizes to silicon oxide bonds. The silicon powder is mixed with the liquid dielectric material, i.e. spin-on dielectric or spin-on glass.

The particles may have a size that is smaller than a tenth of a width of a trench 2 which is filled with the liquid dielectric material comprising the particles to ensure a homogeneous filling with the mixture of liquid dielectric material and the silicon particles.

FIG. 7 to 12 depict process steps of another embodiment of a method for depositing isolating material on a substrate.

Figure 7:
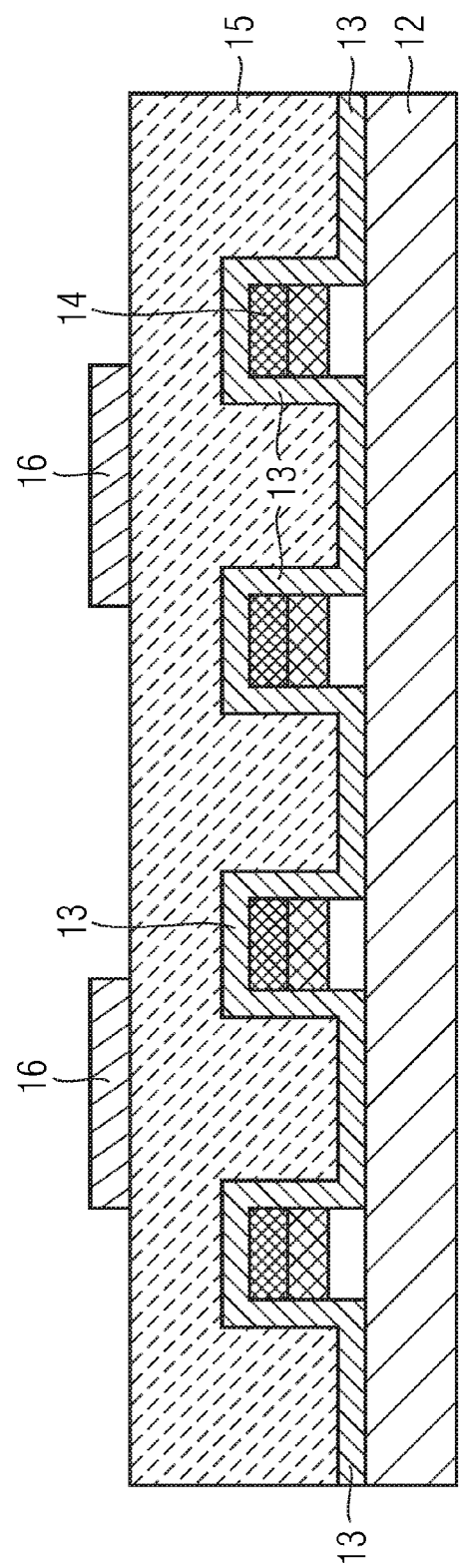
FIGS. 7 to 12 show a process of forming isolating trenches using liquid dielectric material.

FIG. 7 depicts a schematic sectional view of a second substrate 12 comprising electrical or electronic elements, e.g. a transistor and/or an electrical line and/or a capacitor. The second substrate 12 may comprise a memory element with a transistor and a capacitor. On the surface of the second substrate 12, gate stacks 14 are disposed which are covered by an oxide liner 13. The oxide liner 13 covers the surface of the second substrate 12 and the surface of the gate stacks 14. The gate stacks 14 are part of transistors. Source and the drain regions of the transistors are arranged in the second substrate 12 and not shown in the Figure. The oxide liner 13 is covered by a silicon layer 15, e.g. made of an amorphous silicon. On the surface of the silicon layer 15, photoresist layers 16 are arranged between and two gate stacks 14.

Figures 8, 9:
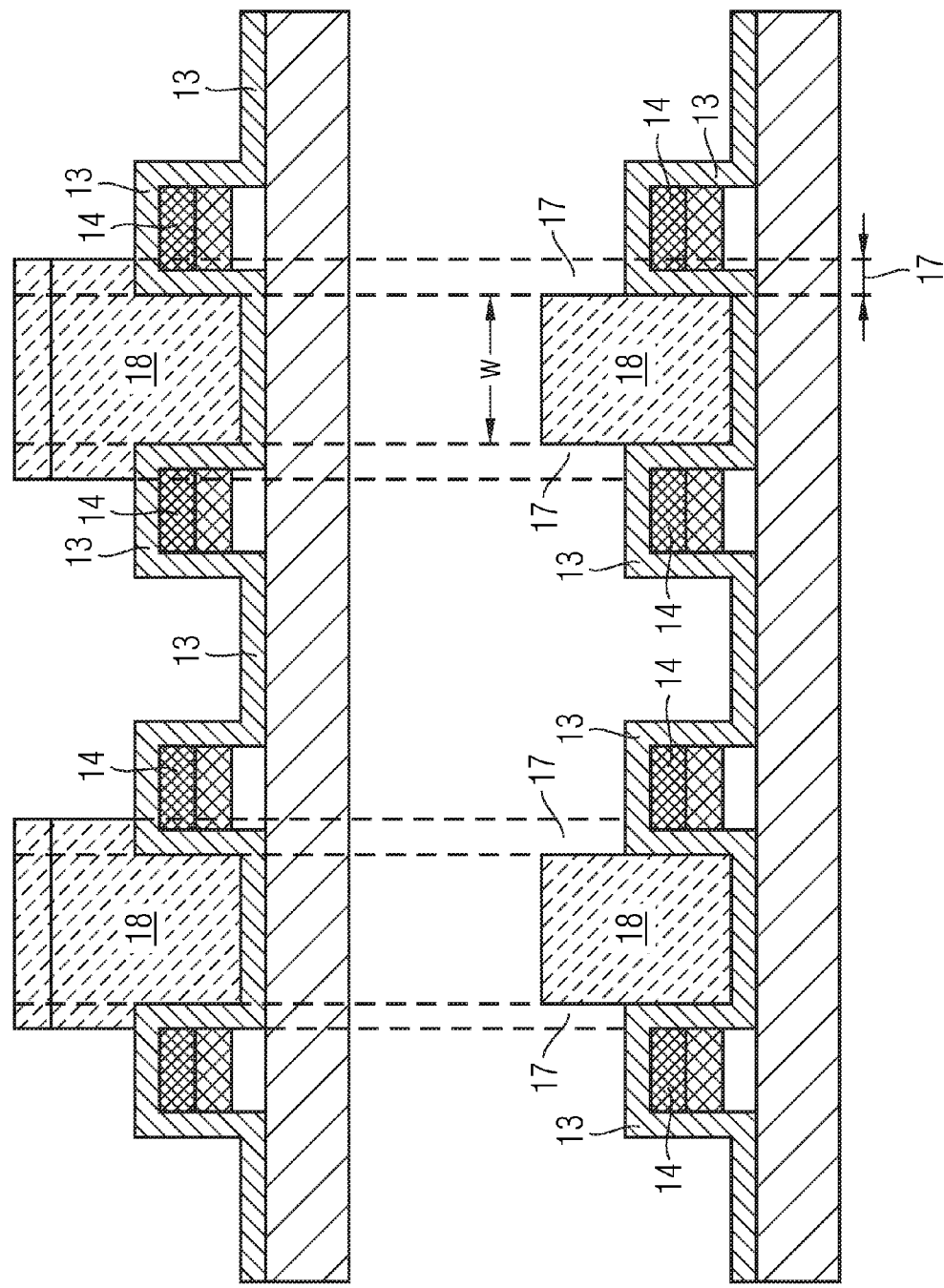

In a subsequent process, the silicon layer 15 is removed in an etching process in the shape of an etch mask which is constituted by the resist layer 16 as shown in FIG. 8. FIG. 8 depicts the usual process step as used in the state of the art.

Figure 10:
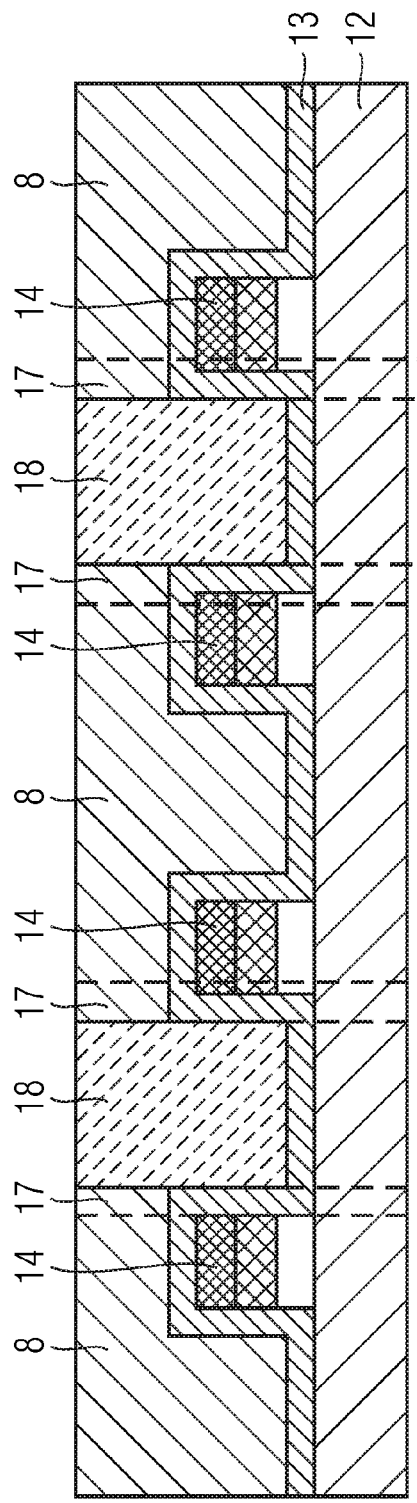

However, according to the new idea, the resist layer 16 comprises a smaller width W. In the shown example the width W equals the distance between two proximated gate stacks 14. In the subsequent etching process, the amorphous silicon layer 15 is removed from the substrate as shown in FIG. 9. In contrast to the state of the art as shown in FIG. 8, the remaining silicon parts 18 are smaller disposing an additional second space 17 for the dielectric material 8 which is deposited on the structure. FIG. 10 depicts the embodiment with the dielectric material 8 which covers the space between the silicon parts 18.

After the filling of the structure with the dielectric material preferably a pre-curing step is carried out which elevates the density of the dielectric material 8. Thereafter, a chemical-mechanical polishing process is carried out in order to remove the dielectric material 8 down to the surface of the silicon parts 18.

Figure 11:
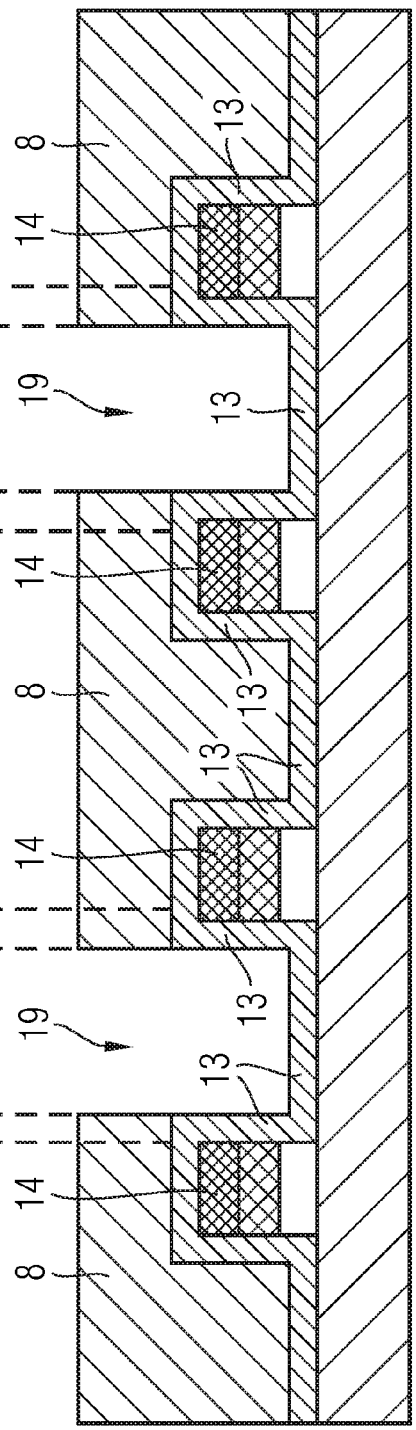

In a subsequent process step, the silicon parts 18 are removed by an etching process. This opens the structure between the gate stacks 14 down to the oxide liner 13. In this way, contact holes 19 are produced between the gate stacks 14 as shown in FIG. 11.

Figure 12:
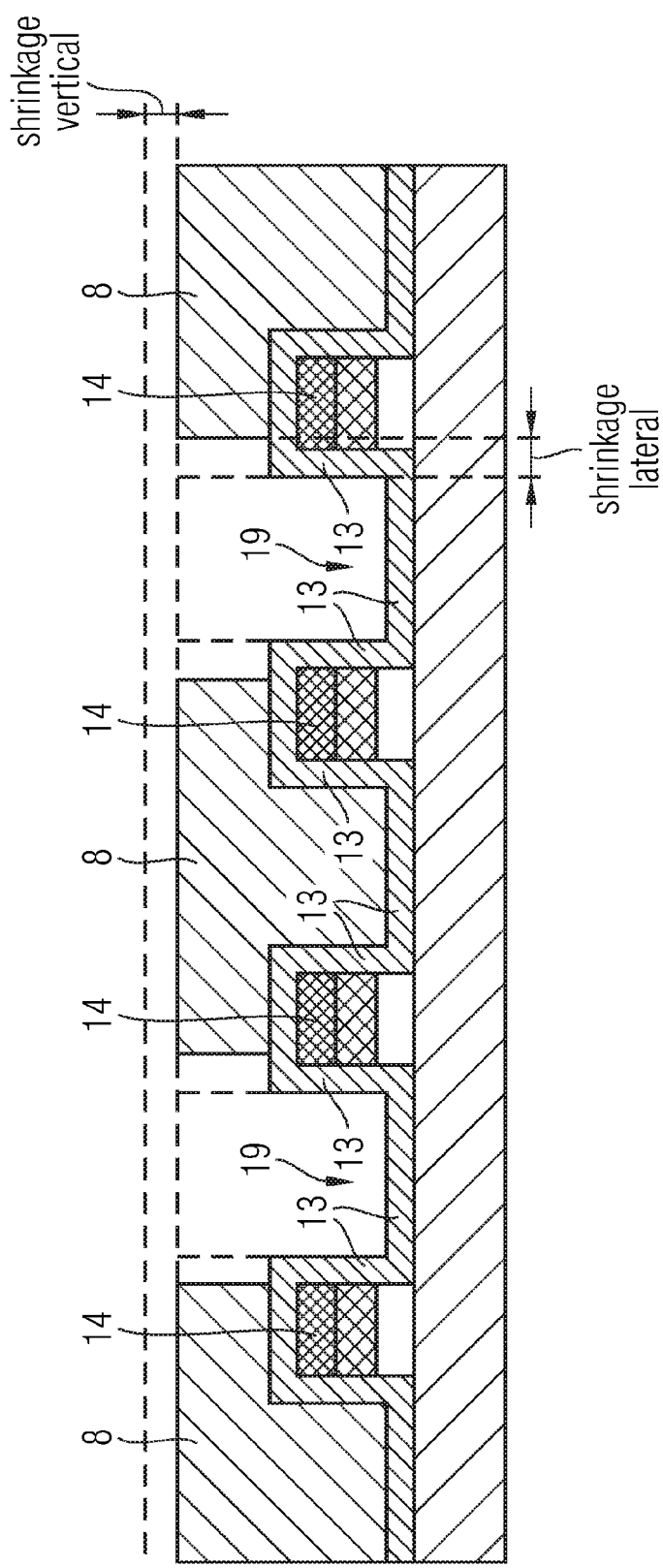

After the etching process of the contact holes 19, a final curing process is accomplished. During the final curing process, the dielectric material 8 shrinks in a lateral dimension and in a vertical dimension, as shown in FIG. 12. The shrinkage in the lateral dimension is preferably of the same size as the lateral dimension of the second space 17. This means that after the final curing process, the dielectric material 8 has the same lateral dimensions as in the state of the art, however, with a higher density and therefore a lower rate for wet etching processes.

In further process steps which are not shown in the Figures, the oxide liner 13 is removed and in the contact holes 19 between the gate stacks 14 and bit contacts are produced between the gate stacks 14 disposing an electrical connecting element between the electrical devices which are located in the second substrate 12 and a bit line which is disposed on the spin-on dielectric material 8.

In this embodiment, the dielectric material 8 constitutes isolating trenches or regions between the bit contacts.

Different materials may be used as dielectric material. For example, silicon oxide may be used that is deposited by a high density plasma or a chemical vapour deposition process. Furthermore, a liquid dielectric material i.e. a spin-on-dielectric material or a spin on glass may be used as dielectric material. In a further embodiment, a liquid dielectric material is used comprising particles that may be chemically converted, e.g. oxidised to compounds with a larger volume as described above.

The basic idea in this embodiment as well is that for the dielectric material 8 an additional free second space 17 in lateral and/or vertical direction prior to the final curing process. During the final curing process, the dielectric material 8 shrinks to the desired dimension in lateral and/or vertical direction. This process has the advantage that the desired dimensions of the dielectric material 8 can be formed with a higher accuracy and the density of the dielectric material 8 is increased after the final curing process. The higher density of the spin-on dielectric material has the advantage that the etching rate for wet etch processes is reduced and the homogeneity of the dielectric material 8 is improved.

What is claimed is:

1. A method of forming an isolating trench of a semiconductor device with a dielectric material, comprising:
   providing a substrate;
   forming a trench in the substrate;
   forming a hole in the substrate that is directly adjacent to the trench and connected by an opening face with the trench;
   filling the hole with sacrificial material by providing a space in the hole with an opening face to the trench;
   depositing dielectric material in the trench and in the space of the hole;
   removing the sacrificial material of the hole; and
   curing the dielectric material.

2. The method according to claim 1, wherein the hole is filled with conductive material forming an electrical contact.

3. The method according to claim 1, wherein the dielectric material is cured before the sacrificial material is removed.

4. The method according to claim 1, wherein the dielectric material is chemical mechanical polished before curing the dielectric material.

5. The method according to claim 1, wherein the recess is filled with metal constituting an electrical contact.

6. The method according to claim 1, wherein a memory device is produced.

7. The method according to claim 1, wherein a DRAM is produced.

8. The method according to claim 1, wherein a liquid dielectric material is filled in the trench and the liquid dielectric material is cured before the sacrificed material is removed of the hole.

9. The method according to claim 8, wherein the liquid material comprises particles, and the liquid dielectric material is annealed in an ambient with oxygen, such that the particles are oxidized forming an insulator.

10. The method according to claim 8, wherein silicon particles are used and oxidized to silicon oxide.

11. The method according to claim 2, wherein the hole is used to form an electrical contact of a capacitor that is arranged in the substrate.

12. The method according to claim 11, wherein the capacitor is part of a memory cell.

13. The method according to claim 2, wherein the contact is formed as a bit contact between a bit line and a transistor of a memory cell that is arranged in the substrate.

14. The method according to claim 10, wherein a shallow trench isolation is formed with the trench filled with the dielectric material.

15. The method according to claim 1, wherein the method is used to form a memory device.

16. The method according to claim 1, wherein the method is used to form a logic device.

17. The method according to claim 1, wherein the liquid dielectric material comprises particles, and the particles are chemically processed forming particles with enlarged volumes compared to the volume of the unprocessed particles.

18. The method according to claim 17, wherein a polysilazane based liquid dielectric material is used.

19. The method according to claim 17, wherein silicon particles are used and the silicon particles are oxidized with oxygen forming silicon oxide.

20. The method according to claim 17, wherein a size of the particles is smaller than a tenth of width of the trench which is filled with the liquid dielectric material comprising the particles.

21. A method of forming an isolating trench on a semiconductor device with a liquid dielectric material, comprising:
   providing a substrate;
   forming a trench in the substrate, that is arranged between sidewalls;
   forming a space in the sidewall that is directly adjacent to the trench and connected by an opening face with the trench;
   depositing dielectric material in the space and in the trench;
   curing the liquid dielectric material;
   removing the sidewalls; and
   curing the dielectric filling of the trench.

* * * * *